(12) United States Patent
Hsieh et al.

(10) Patent No.: US 9,741,600 B2
(45) Date of Patent: *Aug. 22, 2017

(54) SEMICONDUCTOR APPARATUS WITH TRANSPORTABLE EDGE RING FOR SUBSTRATE TRANSPORT

(71) Applicant: Taiwan Semiconductor Manufacturing Co., Ltd., Hsin-Chu (TW)

(72) Inventors: Chih-Chang Hsieh, Hsinchu (TW); Chung-chieh Hsu, New Taipei (TW); Chian-kun Chan, Zhudong Township, Hsinchu County (TW); Chih-Kuo Chang, Baoshan Township, Hsinchu County (TW); Chih-Ping Chen, Hsinchu (TW); Hsu-Shui Liu, Pingjhen (TW); Kai Lo, Taipei (TW); Wei-ting Hsiao, Taichung (TW); Yung-Kai Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/175,820

(22) Filed: Jun. 7, 2016

(65) Prior Publication Data
US 2016/0284584 A1   Sep. 29, 2016

Related U.S. Application Data

(62) Division of application No. 13/859,114, filed on Apr. 9, 2013, now Pat. No. 9,425,077.
(Continued)

(51) Int. Cl.
*H01L 21/687* (2006.01)
*H01L 21/02* (2006.01)
(Continued)

(52) U.S. Cl.
CPC ........ *H01L 21/68707* (2013.01); *C23C 16/18* (2013.01); *C23C 16/4584* (2013.01);
(Continued)

(58) Field of Classification Search
None
See application file for complete search history.

(56) References Cited

U.S. PATENT DOCUMENTS

| 7,358,484 B2 | 4/2008 | Economou et al. |
| 8,721,790 B2 | 5/2014 | Kato et al. |

(Continued)

FOREIGN PATENT DOCUMENTS

| TW | 200715362 | 4/2007 |
| TW | 201130084 A1 | 9/2011 |

(Continued)

OTHER PUBLICATIONS

Official Action issued Aug. 14, 2015 in counterpart Taiwan patent application.

*Primary Examiner* — Robert Carpenter
(74) *Attorney, Agent, or Firm* — Duane Morris LLP

(57) ABSTRACT

An apparatus and method for processing semiconductor substrates provides a substrate stage being a rotatable disc with a solid surface and a terraced edge with upper, intermediate and lower portions of increasing diameter. A hollow edge ring rests on the intermediate edge portion and a substrate disposed on the rotatable disc is lifted and transported by robot blades positioned beneath the edge ring and which lift the edge ring which holds the substrate around its edges. The rotatable disc and edge ring find application in MOCVD and other semiconductor manufacturing tools.

18 Claims, 5 Drawing Sheets

Related U.S. Application Data

(60) Provisional application No. 61/788,421, filed on Mar. 15, 2013.

(51) Int. Cl.
*C23C 16/458* (2006.01)
*C23C 16/18* (2006.01)

(52) U.S. Cl.
CPC .... *C23C 16/4585* (2013.01); *H01L 21/02271* (2013.01); *H01L 21/68735* (2013.01); *H01L 21/68742* (2013.01); *H01L 21/68764* (2013.01)

(56) References Cited

U.S. PATENT DOCUMENTS

| | | |
|---|---|---|
| 2005/0022737 A1 | 2/2005 | Shimizu |
| 2007/0266945 A1 | 11/2007 | Shuto |
| 2009/0139448 A1 | 6/2009 | Hirata |
| 2010/0071624 A1* | 3/2010 | Lee .................. H01L 21/68742 118/729 |
| 2011/0024399 A1* | 2/2011 | Kim .................. H01J 37/32009 219/121.41 |
| 2011/0155058 A1 | 6/2011 | Carlson et al. |
| 2011/0157760 A1 | 6/2011 | Willwerth et al. |
| 2011/0159200 A1* | 6/2011 | Kogure ................ C23C 14/042 427/458 |
| 2011/0303154 A1 | 12/2011 | Kim |
| 2013/0305992 A1 | 11/2013 | Yamamoto |
| 2015/0010381 A1* | 1/2015 | Cai .................. H01L 21/67745 414/806 |

FOREIGN PATENT DOCUMENTS

| | | |
|---|---|---|
| TW | 201131681 A1 | 9/2011 |
| TW | 201137163 A1 | 11/2011 |

* cited by examiner

SEMICONDUCTOR APPARATUS WITH TRANSPORTABLE EDGE RING FOR SUBSTRATE TRANSPORT

RELATED APPLICATIONS

This application is a division of co-pending U.S. application Ser. No. 13/859,114 entitled "SEMICONDUCTOR APPARATUS WITH TRANSPORTABLE EDGE RING FOR SUBSTRATE TRANSPORT" filed Apr. 9, 2013, which claims priority to U.S. Provisional Patent Application No. 61/788,421 filed on Mar. 15, 2013, the contents of which are hereby incorporated by reference herein in their entirety.

TECHNICAL FIELD

The disclosure relates to semiconductor manufacturing and, more particularly, to semiconductor manufacturing tools and methods.

BACKGROUND

The manufacture of semiconductor devices on semiconductor or other substrates requires a multitude of separate processing operations carried out in separate manufacturing tools. Much of the semiconductor manufacturing process is an automated process. This includes the movement and transport of substrates within and throughout manufacturing tools. This also includes the loading and unloading operations associated with a particular piece of manufacturing equipment. The transfer of lots of wafers, i.e. substrates, and individual substrates throughout the fabrication area and to and from the individual manufacturing tools is also desirably an automated robotic operation. It is also desired to carry out cleaning operations of components of the semiconductor manufacturing tools using automated processes, for removing, manipulating and transporting the components.

The use of automated loading and unloading and transferring operations minimizes the number of times an individual must handle a semiconductor substrate, a cassette of semiconductor substrates or components of the manufacturing tools.

In some operations, it is still necessary to load and unload substrates and position components of manufacturing tools manually. In MOCVD (metal organic chemical vapor deposition) and many other operations, substrates are retained on discs that spin rapidly and the discs cannot be formed with any holes therethrough because the inlet and outlet gases are delivered to and exhausted from, the underside of the spinning disc. Since the spinning disc cannot have any holes extending therethrough, they do not include pinholes for receiving automatic substrate transfer holders with pins that are received in such holes. In many systems, the substrate fits snugly within the outer lips of the rotating disc, making it difficult to extract the substrate from the rotating disc. As such, the substrates undergoing MOCVD and many other similar processing operations, must be manually unloaded by hand. This is time-consuming and generates contamination.

Better methods are needed for transporting substrates that cannot be transported utilizing transfer plates with subjacent pins.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Figure 1:
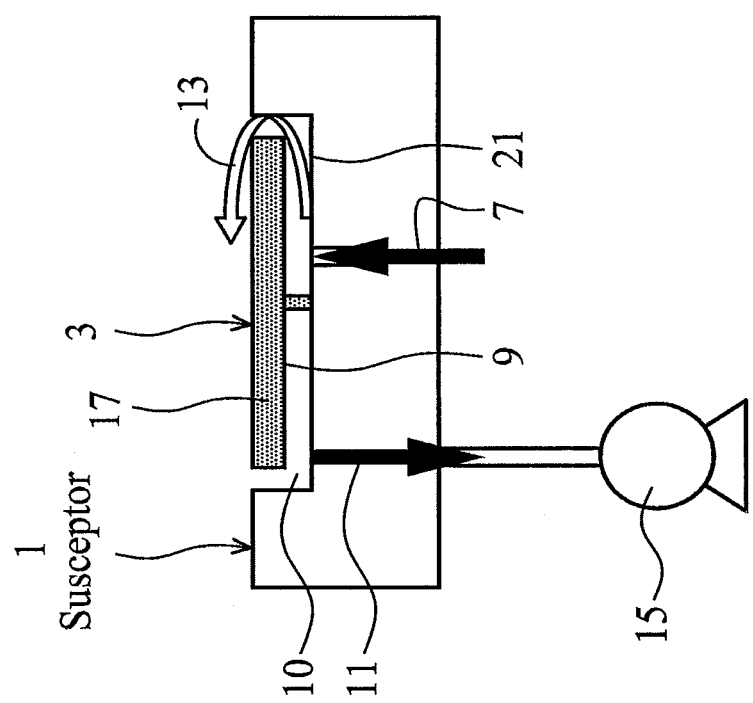
FIG. 1 is a cross-sectional view of an embodiment of a rotatable disc within a susceptor.

FIG. 1 shows a rotatable disc within a susceptor and the rotatable disc/susceptor arrangement is included within various semiconductor manufacturing tools such as MOCVD (metal organic chemical vapor deposition) tools or other CVD tools or other deposition tools used in the semiconductor manufacturing industry. The susceptor/rotatable disc arrangement represents one of multiple susceptor/rotatable disc arrangements found within a semiconductor manufacturing tool such as an MOCVD reactor. A wafer, i.e. substrate, is disposed on the rotatable disc and undergoes processing while the disc is rotating according to various embodiments. Various substrate sizes are used in various embodiments. In one embodiment such as shown in FIG. 1, processing gases are delivered beneath the rotating disc and exhausted through an exit port from beneath the rotating disc and this gas delivery arrangement along with the rotating nature of the disc provides superior uniformity. The rotating disc is solid and includes no holes or other voids extending through the disc.

The disclosure provides a system and technique for removing substrates from the surface of the rotating disc automatically, without damage to the disc, and without using substrate transfer mechanisms that rely on subjacent pins to be received in underlying holes.

Although described in conjunction with MOCVD systems, the edge ring and transfer techniques of the disclosure find application in all semiconductor and other manufacturing tools that utilize chucks, stages or processing plates with solid upper surfaces for receiving substrates.

FIG. 1 shows susceptor 1 which receives one or multiple rotating discs. Rotating disc 3 is received within recess 10 within susceptor 1. Each susceptor 1 may include multiple recesses 10 and associated rotating discs 3 in one or more processing chambers in various manufacturing tools. A plasma generation system generates plasma in the chambers. Rotating disc 3 rotates about rotating axis 5 and rotates at various speeds in various embodiments. Rotating disc 3 is formed of various suitable sturdy and durable materials such as metals, composites graphite and silicon carbide in various embodiments. In one embodiment, rotating disc 3 is formed of a graphite base with a silicon carbide coating. Various mechanical means are used to cause rotating axis 5 to cause rotatable disc 3 to rotate. Arrow 13 indicates one rotation direction, counter-clockwise but in other embodiments, rotatable disc 3 rotates in a clockwise direction as well. Processing gases are delivered from gas sources at gas inlet port 7 and exhausted by gas outlet port 11 before, during and after processing. Gas inlet port 7 directs gas to underside 9 of rotatable disc 3 and gas outlet port 11 in conjunction with pump 15 exhausts gas from the underside 9 location of rotatable disc 5. The gases are used to deposit films on the substrates. Rotatable disc 5 includes surface 17 for receiving a substrate undergoing processing thereon. Surface 17 is solid with no holes therein in some embodiments. Rotatable disc 3 takes on various dimensions and various embodiments and may be sized to accommodate substrates having diameters of about 200 mm, 300 mm, 400 mm or other substrate sizes used in the semiconductor manufacturing industry. Susceptor 1 includes recess 10 with bottom recessed surface 21 for receiving rotatable disc 3 therein.

Figure 2:
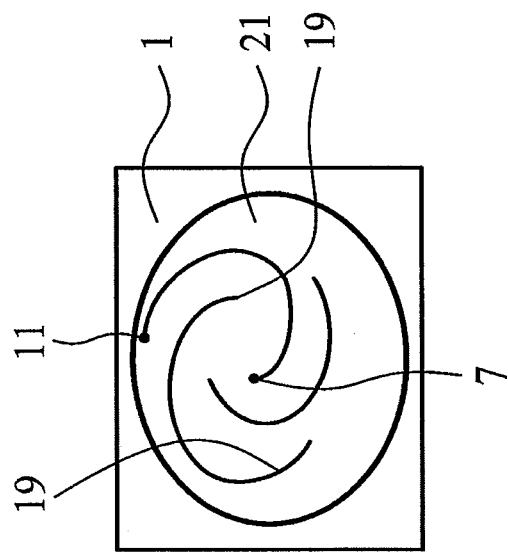
FIG. 2 shows an embodiment of a surface of a susceptor.

FIG. 2 shows a top, plan view of one embodiment of a susceptor. Susceptor 1 and recessed surface 21 are for accommodating a rotatable disc such as rotatable disc 3 shown in FIG. 1. FIG. 2 shows gas inlet port 7 and gas outlet port 11. Grooves 19 provide conduits within which the delivered inlet gases can flow and conduits for gases to be removed at gas outlet port 11. The configuration of grooves 19 is different in various other embodiments and the semi-annular orientations of FIG. 2 are intended to be exemplary and not limiting of the types of the groove orientations through which process and exhaust gases can flow, according to the disclosure.

Figure 3:
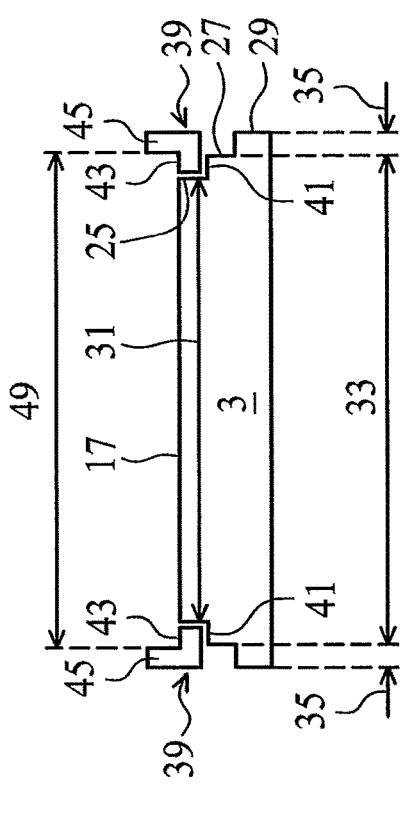
FIG. 3 shows a cross-sectional view of a rotatable disc and edge ring according to an embodiment of the disclosure.

FIG. 3 shows a cross-sectional view of an embodiment of rotatable disc 3. In the embodiment of FIG. 3, the edges of rotatable disc 3 are terraced and include upper edge portion 25, intermediate edge portion 27 and lower edge portion 29. The outer diameter of lower edge portion 29 is greater than the outer diameter of intermediate edge portion 27 which is greater than the outer diameter of upper edge portion 25. Upper edge portion 25 includes an upper outer diameter 31, intermediate edge portion 27 includes an intermediate outer diameter 33 and lower edge portion 29 includes lower outer diameter 35. The opposed edges of rotatable disc 3 are therefore terraced edges and are step-like in nature. Edge ring 39 is positioned slightly above and not in contact with rotatable disc 3 in the illustration of FIG. 3. When in use, however, edge ring 39 advantageously rests on upper surface 41 of intermediate edge portion 27 according to the embodiment of FIG. 3.

Edge ring 39 includes a generally L-shaped cross-section and includes a horizontal portion with horizontal surface 43 and vertical section 45. Edge ring 39 circumferentially surrounds the periphery of rotatable disc 3. Edge ring 39 is formed of silicon carbide, graphite, graphite coated with silicon carbide and various other suitable materials in various embodiments. According to one embodiment, when edge ring 39 rests upon surface 41 of intermediate edge portion 27, horizontal surface 43 is substantially coplanar with surface 17 of rotatable disc 3 and accommodates a substrate thereon. In other embodiments, the horizontal portion of edge ring 39 has other dimensions. In other words, the substrate includes a diameter greater than upper outer diameter 31 of upper edge portion 25. Inner diameter 49 of vertical sections 45 of edge ring 39 is sized to be substantially the same as the diameter of the substrate being accommodated and processed on rotatable disc 3 so that a substrate edge rests on horizontal surface 43.

The dimensions of rotatable disc 3 vary according to the substrates being processed. The thickness of rotatable disc varies and may range from about 0.7 to about 1.5 cm in various embodiments but other thicknesses are used in other embodiments. The relative heights of upper edge portion 25, intermediate edge portion 27 and lower edge portion 29 also vary in various embodiments. The vertical section 45 of edge ring 39 ranges from about 0.1 to 1.0 cm in various embodiments, but other dimensions are used in other embodiments.

Figure 4:
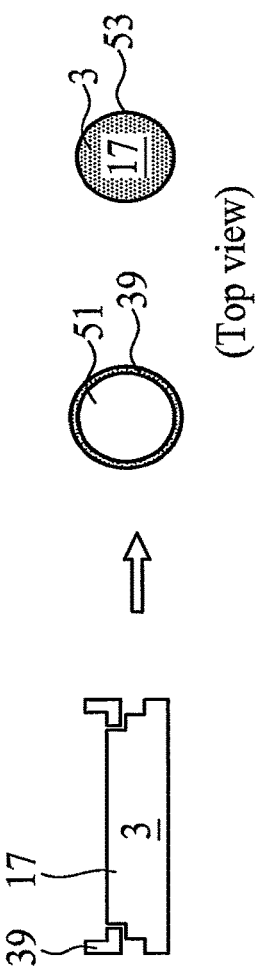
FIG. 4 shows a side view of a rotatable disc and the rotatable disc and an edge ring in a corresponding expanded top view.

FIG. 4 shows rotatable disc 3 including top surface 17 and also edge ring 39. FIG. 4 also shows one advantageous embodiment in which depth 48 of upper edge portion 25 is substantially equal to thickness 47 of the horizontal portion of edge ring 39. The figure also shows a top view of the components presented separately. Edge ring 39 includes hollow center 51 and when positioned over rotatable disc 3, edge ring 39 extends circumferentially around rotatable disc 3. Rotatable disc 3 includes top surface 17 and terraced edge 53 shown more clearly in FIGS. 3 and 5.

Figure 5:
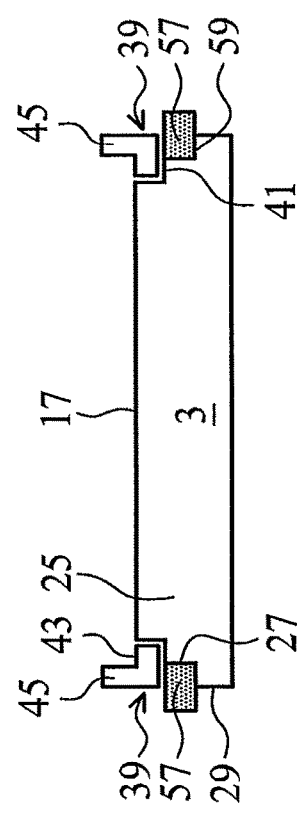
FIG. 5 is a plan view showing a robot transfer blade mating with an embodiment of a rotatable disc and edge ring according to an embodiment of the disclosure.

FIG. 5 shows the arrangement of FIG. 3 with rotatable disc 3 and edge ring 39. Edge ring 39 includes vertical section 45 and horizontal surface 43. Edge ring 39 is adapted to be seated on surface 41 of intermediate edge portion 27 during substrate transport and also during processing in some embodiments. A set of robot blades 57 are disposed along and in contact with the outer edges of intermediate edge portion 27 of rotatable disc 3. In other words, robot blades 57 are separated by a distance substantially equal to intermediate outer diameter 33 (see FIG. 3). Robot blades 57 can be accommodated over base surface 59 of lower edge portion 29. Robot blades 57 are also disposed beneath edge ring 39 and are therefore capable of lifting edge ring 39 and any substrate that may be disposed on surface 17, in particular any substrate that includes a diameter greater than upper outer diameter 31 of upper edge portion 25 and which therefore overhangs the rotatable disc and has outer edges that rest on horizontal surfaces 43 of edge ring 39.

Robot blades 57 form part of different automated robotic devices used for transferring substrates in various types of semiconductor manufacturing tools in various embodiments and are also referred to as robot arms. Robot blades 57 are also sized to fit within recess 10 of susceptor 1 shown in FIG. 1, and coupled to a robotic transfer mechanism. One advantage of the disclosure is that a substrate positioned on rotatable disc 3 can be removed using robot blades along with edge ring 39.

Figure 6:
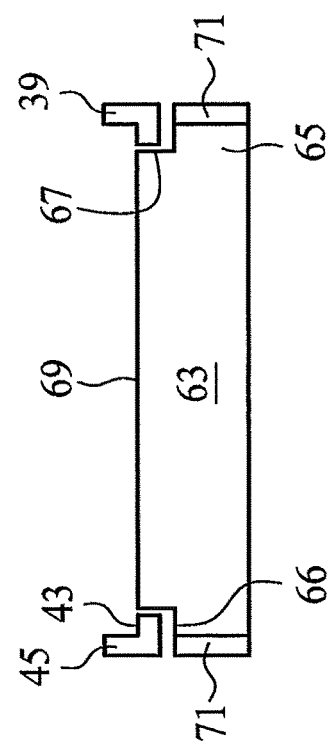
FIG. 6 shows a cross-sectional view of a rotatable disc and edge ring according to another embodiment of the disclosure.

FIG. 6 shows another embodiment in which rotatable disc 63 has opposed terraced edges with only two distinguishable sections—lower portion 65 and upper portion 67 with layer portion 65 having a larger outer diameter. Rotatable disc 63 also fits in recess 10 in susceptor 1 such as shown in FIG. 1. Rotatable disc 63 includes top surface 69 which is solid in some embodiments. Rotatable disc 63 is sized in conjunction with edge ring 39 such that edge ring 39 can be seated on surface 66 of lower portion 65 and such that a substrate disposed on rotatable disc 63 includes a diameter substantially equal to the inner diameter of vertical sections 45 of edge ring 39 when seated on top surface 69 and substantially coplanar horizontal surface 43. According to this embodiment, rotatable disc 63 may be sized to fit within an opening in a susceptor such that robot blades 71 can extend beneath edge ring 39 and lift and transport edge ring 39 along with a substrate retained by edge ring 39. Robot blades are spaced apart substantially by the outer diameter of lower portion 65.

The two illustrations of FIGS. 3, 5 and 6 show embodiments of the disclosure but are not intended to be limiting. Various other arrangements in which the rotatable disc has an upper portion with a reduced outer diameter that accommodates an edge ring around the periphery of the disc, and a subjacent portion that accommodates robot arms under and capable of lifting the edge ring, are used in other embodiments.

Figure 7:
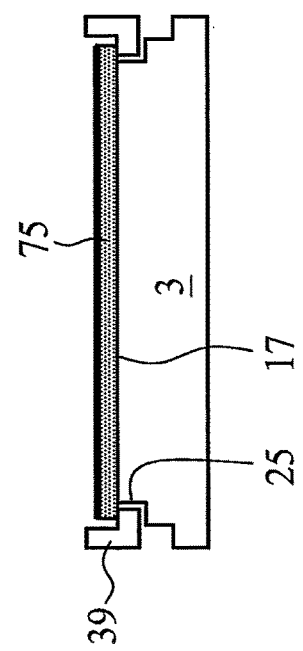
FIG. 7 shows a substrate disposed on an embodiment of a rotatable disc and edge ring.

FIG. 7 shows an embodiment in which rotatable disc 3 and edge ring 39 include substrate 75 thereon. It can be seen that substrate 75 includes a diameter greater than the diameter of surface 17 of rotatable disc 3 which is equivalent to the upper outer diameter of upper edge portion 25 of rotatable disc 3 as shown more clearly in FIG. 3.

Figure 8A:
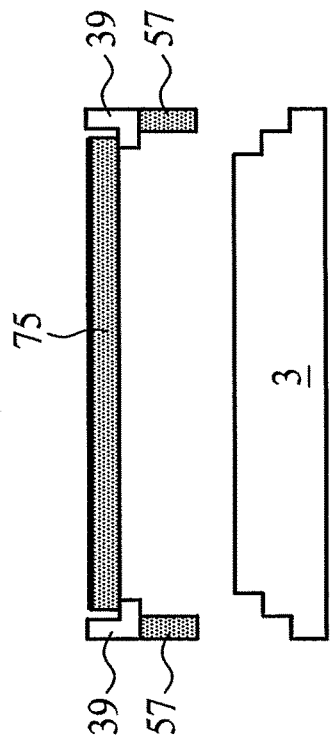
FIGS. 8A and 8B are side views showing a substrate being transferred from a rotatable disc using a robot blade, from two different perspectives.
Figure 8B:
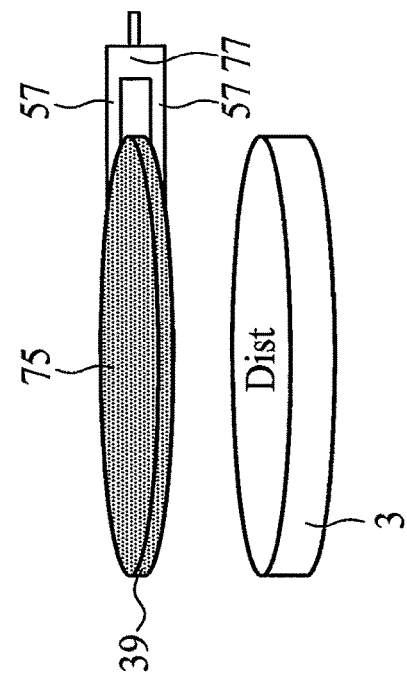

FIGS. 8A and 8B show a substrate such as the one shown in FIG. 7, being transported, i.e. lifted off of rotatable disc 3 using edge ring 39 and robot blades 57. In FIG. 8A, substrate 75 is retained by edge ring 39 and lifted by opposed robot blades 57 and held over rotatable disc 3. The peripheral edges of substrate 75 are retained on the horizontal portion of edge ring 39. FIG. 8B shows a different rotational angle of the drawing of FIG. 8A and shows rotatable disc 3, substrate 75 and opposed robot blades 57 coupled to robotic transfer mechanism 77 that lifts edge ring 39 and substrate 75. Robotic transfer mechanism 77 is part of various robotic devices that are automatically or manually controlled, in various embodiments.

Figure 9:
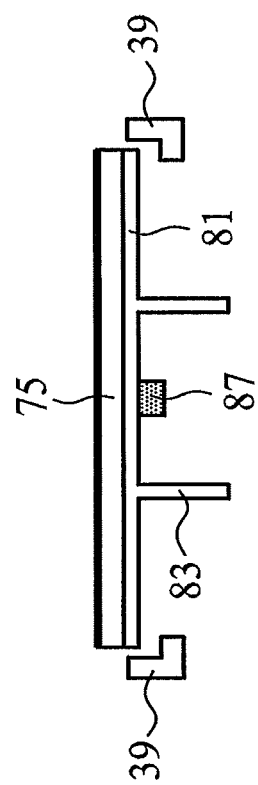
FIG. 9 shows a substrate on a lifter mechanism in a lifter station in position to be transported along with the edge ring according to an embodiment of the disclosure.

FIG. 9 shows substrate 75 on lifter mechanism 81 including pins 83 such as may be used in a lifter or transfer module of an apparatus such as in another station of an MOCVD or other processing apparatus. Robot blade 87 is capable of lifting an assembly including substrate 75 disposed on lifter mechanism 81 and transporting substrate 75 to a processing chamber. Robot blade 87 is capable of placing the assembly including substrate 75 disposed on lifter mechanism 81 on edge rings 39 such as may be transported and used in recesses 10 of susceptor 1 shown in the previous figures. Robot blade 87 is capable of transporting an assembly including substrate 75 disposed on lifter mechanism 81 to a processing chamber and working in conjunction with a robotics/transfer system that also includes robotic transfer mechanism 77 with robot blades 57 and other transfer arms and blades.

According to one aspect, an apparatus for processing semiconductor substrates is provided. The apparatus comprises: a rotatable disc capable of receiving a semiconductor substrate thereon and having a terraced outer edge having an upper edge portion with a smaller upper outer diameter than a lower outer diameter of a lower edge portion; a susceptor adapted to receive the rotatable disc thereon or therein; and an edge ring extending circumferentially around a periphery of the rotatable disc and configured to rest on a top surface of the lower edge portion, the edge ring including a horizontal surface capable of receiving a peripheral edge of the substrate thereon and a vertical portion disposed peripherally outside the horizontal surface.

In one embodiment, the edge ring has an L-shaped cross section and the rotatable disc has a solid upper surface.

In one embodiment, the rotatable disc includes the terraced outer edge further including a bottom edge portion with a bottom outer diameter greater than the lower outer diameter.

In one embodiment, the apparatus further comprises a substrate lifting robot blade having a duality of lifting arms, the duality of lifting arms spaced apart by substantially the lower outer diameter and capable of lifting the edge ring with the semiconductor substrate thereon.

In one embodiment, an inner diameter of the vertical portion of the edge ring is substantially equal to a diameter of the substrate.

In one embodiment, the substrate includes a diameter greater than a diameter of a top surface of the rotatable disc.

In one embodiment, the horizontal surface of the edge ring is substantially co-planar with an upper surface of the rotatable disc when the edge ring is disposed on a peripheral edge of the outer edge portion.

In one embodiment, the vertical portion of the edge ring extends above an upper surface of the rotatable disc.

In one embodiment, the rotatable disc is in a chamber and the apparatus further comprises: a gas inlet port in the susceptor and capable of delivering inlet gas to an underside of the rotatable disc; a gas outlet port disposed under the rotatable disc and a vacuum system capable of exhausting gas from the susceptor; and a plasma generation system capable of providing a plasma to the chamber.

In one embodiment, the apparatus comprises a MOCVD (metal-organic chemical vapor deposition) apparatus.

In another aspect, an apparatus for processing semiconductor substrates is provided. The apparatus comprises: a rotatable disc capable of receiving a semiconductor substrate thereon and having a terraced outer edge including an upper edge portion, an intermediate edge portion and a lower edge portion, the intermediate edge portion having an intermediate outer diameter greater than an upper outer diameter of the upper edge portion and less than a lower outer diameter of the lower edge portion; an edge ring adapted and sized to be disposed on a top surface of the intermediate edge portion, the edge ring including a horizontal surface substantially coplanar with a top surface of the rotatable disc and a vertical portion circumferentially outside the horizontal surface; a substrate adapted and sized to be disposed on the upper surface and the horizontal surface of the edge ring and including a diameter greater than an outer diameter of the upper surface; and a wafer blade assembly including at least a duality of substrate lifting blades, the substrate lifting blades spaced apart by a distance substantially equal to the intermediate outer diameter.

In one embodiment, the apparatus further comprises a processing chamber with a susceptor adapted to receive the rotatable disc and the edge ring therein; a gas inlet port in the susceptor and capable of delivering inlet gas to an underside of the rotatable disc; and a gas outlet port disposed under the rotatable disc and a vacuum system capable of exhausting gas from the susceptor through the gas outlet port.

In one embodiment, the edge ring has a substantially L-shaped cross section and the substrate has a diameter substantially equal to an inner diameter of the vertical portion.

In one embodiment, the apparatus comprises a MOCVD (metal-organic chemical vapor deposition) apparatus and further comprising a processing chamber with a plurality of susceptors, each adapted to receive a corresponding further the rotatable disc and the edge ring therein.

According to another aspect, a method for processing semiconductor substrates is provided. The method comprises: providing a disc/edge ring assembly, the disc/edge ring assembly including a disc with a terraced peripheral edge including at least an upper edge portion with an upper outer diameter less than a lower outer diameter of a lower edge portion and an edge ring disposed over the lower edge portion and including an outer vertical portion circumferentially surrounding the disc/edge ring assembly; disposing a substrate on the disc/edge ring assembly such that the substrate rests on at least an upper surface of the disc, the substrate including a diameter greater than the upper outer diameter; and lifting the substrate from the disc/edge ring assembly by inserting robot blades beneath the edge ring and lifting the edge ring with peripheral edges of the substrate resting on a horizontal surface of the edge ring.

In one embodiment, the providing a disc/edge ring assembly comprises providing the a disc/edge ring assembly in a recess portion of a MOCVD (metal organic chemical vapor deposition) apparatus.

In one embodiment, the disc is a rotating disc and further comprising rotating the disc while depositing a film on the substrate.

In one embodiment, the disc is a rotating disc and further comprising rotating the disc while depositing a film on the substrate.

In one embodiment, the method further comprises delivering processing gases to an underside of the rotating disc during the rotating and depositing.

In one embodiment, the method further comprises the robot blades transporting the edge ring with the peripheral edges of the substrate resting on a horizontal surface thereof, to a load station.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for processing a semiconductor substrate, said method comprising:
    providing a disc/edge ring assembly, said disc/edge ring assembly including a disc with a terraced peripheral edge including at least an upper edge portion with an upper outer diameter less than a lower outer diameter of a lower edge portion and an edge ring disposed over said lower edge portion and including an outer vertical portion circumferentially surrounding said disc/edge ring assembly;
    disposing a substrate on said disc/edge ring assembly such that said substrate rests on at least an upper surface of said disc, said substrate including a diameter greater than said upper outer diameter;
    inserting robot blades beneath said edge ring; and
    lifting said edge ring while keeping peripheral edges of said substrate resting on a horizontal surface of said edge ring thereby causing said substrate to be lifted from said disc/edge ring assembly.

2. The method as in claim 1, wherein said providing a disc/edge ring assembly comprises providing said disc/edge ring assembly in a recess portion of a MOCVD (metal organic chemical vapor deposition) apparatus.

3. The method as in claim 1, wherein said disc is a rotatable disc.

4. The method as in claim 3, further comprising rotating said disc while depositing a film on said substrate.

5. The method as in claim 4, further comprising delivering processing gases to an underside of said rotating disc during said rotating and depositing.

6. The method as in claim 4, wherein said substrate contacts said disc while said disc is rotating.

7. The method as in claim 1, further comprising said robot blades transporting said edge ring with said peripheral edges of said substrate resting on a horizontal surface thereof, to a load station.

8. A method for processing a semiconductor substrate, said method comprising:
    providing a rotatable disc having an upper surface capable of receiving a semiconductor substrate thereon and having a terraced outer edge including an upper edge portion, an intermediate edge portion and a lower edge portion, said intermediate edge portion having an intermediate outer diameter greater than an upper outer diameter of said upper edge portion;
    providing an edge ring on a top surface of said intermediate edge portion, said edge ring including a horizontal surface substantially coplanar with a top surface of said rotatable disc and a vertical portion circumferentially outside said horizontal surface, wherein said upper surface of said rotatable disc and said horizontal surface of said edge ring are shaped and sized to receive a substrate thereon;
    positioning said substrate on said disc and edge ring such that said substrate rests on at least an upper surface of said disc, said substrate including a diameter greater than said upper outer diameter;
    inserting robot blades beneath said edge ring; and
    lifting said edge ring while keeping peripheral edges of said substrate resting on said horizontal surface of said edge ring thereby causing said substrate to be lifted from said rotatable disc.

9. The method as in claim 8, wherein said inserting at least one robot blade comprises inserting a plurality of robot blades.

10. The method as in claim 8, further comprising rotating said disc.

11. The method as in claim 10, wherein said substrate contacts said disc while said disc is rotating.

12. The method as in claim 8, wherein said upper surface has an outer diameter smaller than said substrate.

13. The method as in claim 8, wherein the intermediate outer diameter is less than a lower outer diameter of said lower edge portion.

14. A method for processing a semiconductor substrate, said method comprising:

providing a rotatable disc having an upper surface capable of receiving a semiconductor substrate thereon and having a terraced outer edge including an upper edge portion, an intermediate edge portion and a lower edge portion, said intermediate edge portion having an intermediate outer diameter greater than an upper outer diameter of said upper edge portion and less than a lower outer diameter of said lower edge portion;

providing an edge ring on a top surface of said intermediate edge portion, said edge ring including a horizontal surface substantially coplanar with a top surface of said rotatable disc, wherein said upper surface of said rotatable disc and said horizontal surface of said edge ring are shaped and sized to receive a substrate thereon, and said upper surface has an outer diameter smaller than said substrate;

positioning said substrate on said disc and edge ring such that said substrate rests on at least an upper surface of said disc, said substrate including a diameter greater than said upper outer diameter;

rotating said disc while depositing a film on said substrate;

inserting robot blades beneath said edge ring; and lifting said edge ring while keeping peripheral edges of said substrate resting on said horizontal surface of said edge ring thereby causing said substrate to be lifted from said rotatable disc.

15. The method as in claim 14, wherein said substrate contacts said disc while said disc is rotating.

16. The method as in claim 14, wherein said edge ring further includes a vertical portion circumferentially outside said horizontal surface.

17. The method as in claim 14, wherein said inserting at least one robot blade comprises inserting a plurality of robot blades.

18. The method as in claim 17, further comprising delivering processing gases to an underside of said rotating disc during said rotating and depositing.

* * * * *